United States Patent
Brochu, Jr. et al.

(10) Patent No.: US 10,103,060 B2
(45) Date of Patent: Oct. 16, 2018

(54) TEST STRUCTURES FOR DIELECTRIC RELIABILITY EVALUATIONS

(71) Applicant: GLOBALFOUNDRIES INC., Grand Cayman (KY)

(72) Inventors: David G. Brochu, Jr., East Hardwick, VT (US); Roger A. Dufresne, Fairfax, VT (US); Baozhen Li, South Burlington, VT (US); Barry P. Linder, Hastings-on-Hudson, NY (US); James H. Stathis, Poughquag, NY (US); Ernest Y. Wu, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 521 days.

(21) Appl. No.: 14/742,895

(22) Filed: Jun. 18, 2015

(65) Prior Publication Data
US 2016/0372389 A1    Dec. 22, 2016

(51) Int. Cl.
| H01L 21/768 | (2006.01) |
| H01L 21/66 | (2006.01) |
| G01R 31/44 | (2006.01) |
| G01R 27/26 | (2006.01) |
| G01R 31/28 | (2006.01) |

(52) U.S. Cl.
CPC .... *H01L 21/76885* (2013.01); *G01R 27/2617* (2013.01); *G01R 31/2856* (2013.01); *G01R 31/44* (2013.01); *H01L 22/34* (2013.01)

(58) Field of Classification Search
CPC .............. H01L 21/76885; H01L 22/34; G01R 31/2858; G01R 31/2863

USPC .............. 324/500, 762.01–763.02, 600, 663, 324/671–673, 762.1, 757.05, 525–528
See application file for complete search history.

(56) References Cited

U.S. PATENT DOCUMENTS

| 6,049,213 A | 4/2000 | Abadeer |
| 6,414,508 B1 | 7/2002 | London |
| 6,664,800 B2 | 12/2003 | Chacon et al. |
| 6,724,214 B2 | 4/2004 | Manna et al. |
| 7,298,161 B2 | 11/2007 | Bernstein et al. |
| 7,453,280 B1 | 11/2008 | Liang et al. |
| 7,579,859 B2 | 8/2009 | Liao et al. |
| 8,578,241 B2 | 11/2013 | Xia et al. |
| 8,610,451 B2 | 12/2013 | Ahsan et al. |

(Continued)

FOREIGN PATENT DOCUMENTS

| CN | 101577265 B | 8/2011 |
| CN | 101752346 B | 11/2011 |

(Continued)

*Primary Examiner* — Melissa Koval
*Assistant Examiner* — Trung Nguyen
(74) *Attorney, Agent, or Firm* — Thompson Hine LLP; Anthony Canale

(57) ABSTRACT

Methods and test structures for testing the reliability of a dielectric material. The test structure may include a first row of contacts and a line comprised of a conductor. The line is laterally spaced in a direction at a minimum distance from the first row of contacts. The test structure further includes a second row of contacts laterally spaced in the direction from the first row of contacts by a distance equal to two times a minimum pitch. The line is laterally positioned between the first row of contacts and the second row of contacts.

20 Claims, 2 Drawing Sheets

(56) References Cited

U.S. PATENT DOCUMENTS

| | | |
|---|---|---|
| 8,642,452 B2 | 2/2014 | Abou-Khalil et al. |
| 2012/0187974 A1 | 7/2012 | Brochu, Jr. et al. |
| 2012/0214351 A1* | 8/2012 | Shiratori ............ H01R 13/6471 439/692 |
| 2014/0077333 A1* | 3/2014 | Son .................... H01L 21/7682 257/522 |

FOREIGN PATENT DOCUMENTS

| | | |
|---|---|---|
| CN | 101740549 B | 8/2012 |
| WO | WO2010110890 A1 | 9/2010 |

* cited by examiner

TEST STRUCTURES FOR DIELECTRIC RELIABILITY EVALUATIONS

BACKGROUND

The invention relates generally to semiconductor device fabrication and, in particular, to structures and methods for testing the reliability of a dielectric layer.

Time-dependent dielectric breakdown (TDDB) is a progressive failure mechanism observed in chips. Time-dependent dielectric breakdown occurs over time and may eventually cause the dielectric layer to break down from the extended application of an operating voltage during operation. When a chip is operated for lengthy periods at normal supply voltages, the leakage current increases gradually as defects are accumulated in the dielectric layer. This process may ultimately lead to breakdown of the dielectric layer and failure due to the loss of the electrical insulating properties of the dielectric layer.

Reliability tests are routinely used to estimate an expected lifetime of a dielectric layer so that chip performance can be guaranteed to remain within specification for a predetermined period of time. Lifetimes are typically obtained by extrapolating TDDB data from small test structures to large chip areas. Under operating conditions with normal supply voltages biasing the gate, reliability testing would take an impractically long period of time. Consequently, reliability testing is usually performed by applying excess electrical stress in the form of voltage and/or current on the dielectric layer. The stress promotes the faster accumulation of defects, which may accelerate the breakdown of the dielectric layer. The breakdown of the dielectric layer may be further accelerated by testing at elevated temperatures. The lifetime of the dielectric layer under operating conditions can then be determined from an extrapolation of the results of reliability testing.

Improved methods and test structures for testing the reliability of a dielectric layer are needed.

SUMMARY

In an embodiment of the invention, a test structure is provided for testing reliability of a dielectric material. The test structure includes a first row of contacts and a linear feature comprised of a conductor. The linear feature is laterally spaced in a first direction at a minimum distance from the first row of contacts. The test structure further includes a second row of contacts laterally spaced in the first direction from the first row of contacts by a distance equal to two times a minimum pitch. The linear feature is laterally positioned between the first row of contacts and the second row of contacts.

In another embodiment of the invention, a method is provided for forming a structure used to test reliability of a dielectric material. The method includes forming a first row of contacts and forming a linear feature comprised of a conductor. The linear feature is laterally spaced in a direction at a minimum distance from the first row of contacts. The method further includes forming a second row of contacts laterally spaced in the direction from the first row of contacts by a distance equal to two times a minimum pitch. The linear feature is laterally positioned between the first row of contacts and the second row of contacts.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
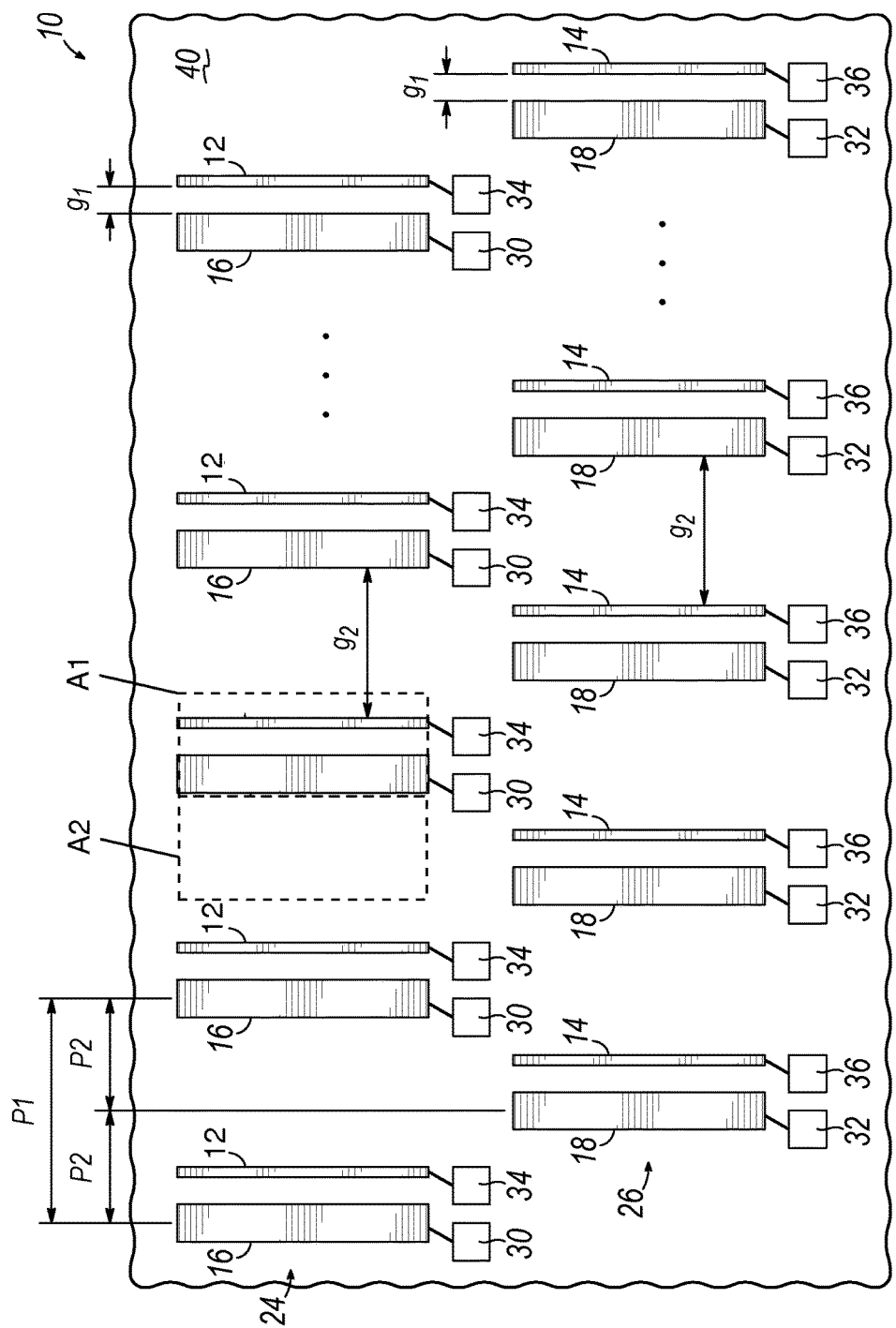
FIG. 1 is a diagrammatic view of an embodiment of a test structure for testing the reliability of a dielectric layer in a chip.

With reference to FIG. 1 and in accordance with an embodiment of the invention, a test structure 10, which is formed on a substrate, includes linear features in the form of a plurality of lines 12, 14 and a plurality of rows 16, 18 of contacts that are arranged in a pattern. The rows 16 of contacts are interleaved with the lines 12. Each row 16 of contacts is positioned with a juxtaposed arrangement adjacent to a respective one of the lines 12 that is its nearest neighbor and is separated from it by a gap $g_1$ which is equal to a minimum distance between each line 12 and the adjacent row 16 of contacts as a separation distance under the design rules. Each row 16 of contacts is positioned with a juxtaposed arrangement adjacent to another of the lines 12 and is separated from the adjacent nearest-neighbor line 12 by a gap $g_2$ that is greater than $g_1$. The rows 18 of contacts are interleaved with the lines 14. Each row 18 of contacts is positioned with a juxtaposed arrangement adjacent to a respective one of the lines 14 that is its nearest neighbor and is separated from it by the gap, $g_1$, which is equal to a minimum distance between each line 14 and the adjacent row 18 of contacts as a separation distance under the design rules. Each row 18 of contacts is positioned with a juxtaposed arrangement adjacent to another of the lines 14 and is separated from the adjacent nearest-neighbor line 14 by a gap $g_2$ that is greater than $g_1$.

The lines 12 and rows 16 of contacts are collectively arranged in a feature row 24 with a given pitch $P_1$. The lines 12 have a length (i.e., greatest dimension and the dimension transverse to the pitch spacing) that is aligned parallel to the length (i.e., greatest dimension and the dimension transverse to the pitch spacing) of the rows 16 of contacts. Each correlated pair of lines 12 and rows 16 of contacts separated by the gap $g_1$ comprises a unit, and the correlated pairs are arranged in a repeating pattern within the feature row 24. The correlated pairs of lines 12 and rows 16 of contacts in the feature row 24 represent identical features in a feature pattern. The pitch $P_1$ represents the linear spacing between identical features in the repeating pattern of correlated pairs of lines 12 and rows 16 of contacts. In the representative embodiment, the pitch $P_1$ represents the linear spacing between adjacent rows 16 of contacts. Alternatively, the pitch $P_1$ may represent the linear spacing between adjacent lines 12.

The lines 14 and rows 18 of contacts are collectively arranged in a feature row 24 with a given pitch $P_1$. The lines 14 have a length (i.e., greatest dimension and the dimension transverse to the pitch spacing) that is aligned parallel to the length (i.e., greatest dimension and the dimension transverse to the pitch spacing) of the rows 18 of contacts. Each correlated pair of lines 14 and rows 18 of contacts separated by the gap $g_1$ comprises a unit, and the correlated pairs are arranged in a repeating pattern within the feature row 24. The correlated pairs of lines 14 and rows 18 of contacts in the feature row 24 represent identical features in a feature pattern. The pitch $P_1$ represents the linear spacing between the identical elements in the repeating pattern of correlated pairs of lines 14 and rows 18 of contacts. In the representative embodiment, the pitch $P_1$ represents the linear spacing between adjacent rows 18 of contacts. Alternatively, the pitch $P_1$ may represent the linear spacing between adjacent lines 14.

The feature rows 24, 26 are offset vertically by a distance such that the identical elements in the different rows do not overlap. Pads 30, 34 are formed adjacent to the lines 12 and rows 16 of contacts in feature row 24 and are positioned between feature row 24 and feature row 26. Each pad 30 is coupled by wiring with the contacts in one of the rows 16, and each pad 34 is coupled by wiring with one of the lines 12. Pads 32, 36 are formed adjacent to the lines 14 and rows 18 of contacts in feature row 26. Each pad 32 is coupled by wiring with the contacts in one of the rows 18, and each pad 36 is coupled by wiring with one of the lines 14.

The identical elements in feature row 24 are offset laterally relative to the identical elements in feature row 26. In one embodiment, the pitch P1 is equal to twice the offset distance, which is equal to a pitch P2. For example, each row 18 of contacts in feature row 24 is shifted laterally by a distance equal to the pitch P1, which is equal to twice the pitch $P_2$. The result of the lateral shifting is that an open or vacant space (i.e., an area A2) is defined between adjacent identical elements in feature row 24 and an open or vacant space (i.e., an area A2) is defined between adjacent identical elements in feature row 26.

The pitch P2 may be equal to the minimum pitch of a device design that is being tested for dielectric reliability using the test structure 10. The pitch P1 may be equal to two times the minimum pitch P2 of the tested device design, which may be referred to as double-pitched. Each correlated pair of lines 12 and rows 16 of contacts occupies a footprint given by an area A1. Each correlated pair of lines 14 and rows 18 of contacts also occupies a footprint given by an area A1. Adjacent correlated pairs in each of the feature rows 24, 26 is separated by an area A2, which does not include lines or contacts and which is the result of double-pitched spacing. The areas A1 and A2 may be equal in dimensions and, in particular, may be equal in the dimension that is parallel to the pitch P1. As a result, the footprint of each correlated pair of lines 12 and rows 16 of contacts occupying an area A1 can be fitted into the area A2, and the footprint of each correlated pair of lines 14 and rows 18 of contacts occupying an area A1 can be fitted into the area A2.

The test structure 10 may be formed on a substrate, such as a silicon wafer. The lines 12, 14 may be comprised of a conductor, such as polycrystalline silicon (i.e., polysilicon) deposited by a chemical vapor deposition process. In one embodiment, the lines 12, 14 may represent gate electrodes formed from a deposited layer stack of polysilicon and an underlying gate dielectric comprised of a layer of a dielectric material, such as silicon dioxide, that is patterned using photolithography and etching processes. In this embodiment, the test structure 10 emulates the device structure of a field-effect transistor in order to test the testing the reliability of the dielectric layer between the gate electrode and adjacent contacts to the source and drain regions.

The gaps $g_1$, $g_2$, as well as the space around other portions of the test structure 10, are filled with portions of a dielectric material from a dielectric layer 40. The dielectric layer 40 may be comprised of silicon dioxide ($SiO_2$), borophosphosilicate glass (BPSG), silicon nitride ($Si_3N_4$), fluorine-doped silicon glass (FSG), and combinations of these and other dielectric materials. The individual contacts in the rows 16, 18 may be comprised of a conductive material, such as tungsten, deposited in vias defined in the dielectric layer 40 by photolithography and etching processes. The pads 30, 32, 34, 36 and associated wiring may be comprised of a conductive material, such as copper (Cu), and may be formed by a damascene process in another dielectric layer formed on the dielectric layer 40. The pads 30, 32, 34, 36 are accessible at the surface of the dielectric layer 40 for testing with a testing probe.

The test structure 10 may be used to study the dielectric reliability of the portions of the dielectric layer 40 in the gap $g_1$ between the each correlated pair of lines 12 and rows 16 of contacts, and the gap $g_1$ between the each correlated pair of lines 14 and rows 18 of contacts. The arrangement of the identical elements in the test structure may prevent interference in the test results from multiple dielectric breakdown modes. Dielectrics with different spacing (or thickness) at different sides of a test structure may create bimodal or multiple modes, which can complicate the data interpretation and modeling. The test structure 10 is single sided in that dielectric breakdown can only occur within the gap $g_1$ and does not occur in the larger gaps $g_2$ created by the double-pitched spacing.

The double-pitched spacing of the correlated pairs of lines 12 and rows 16 of contacts and the double-pitched arrangement of the correlated pairs of lines 14 and rows 18 of contacts also prevents the propagation of dielectric breakdown from one side of the test structure 10 to the other side of the test structure 10. As mentioned above, the test structure 10 is single sided in that dielectric breakdown can only occur within the gap $g_1$ and does not occur in the larger gaps $g_2$ created by the double-pitched spacing. As a result, propagation of the breakdown does not occur as may occur in test structures with single-pitched spacing.

The presence of pads 30, 34 associated with each correlated pair of lines 12 and rows 16 of contacts and pads 32, 36 associated with each correlated pair of lines 14 and rows 18 of contacts provides flexibility as to the elements of the test structure 10 that are wired in parallel during testing. This may permit the interference effect from multiple dielectric breakdown modes to be studied without propagation effects.

A wide variety of data generated using the test structure 10 may provide novel breakdown statistics for modeling and improve reliability projection because the propagation of dielectric breakdown from one side to the other side of the test structure is prevented by eliminating the adjacent gate/contact with the double-pitch spacing.

Figure 2:
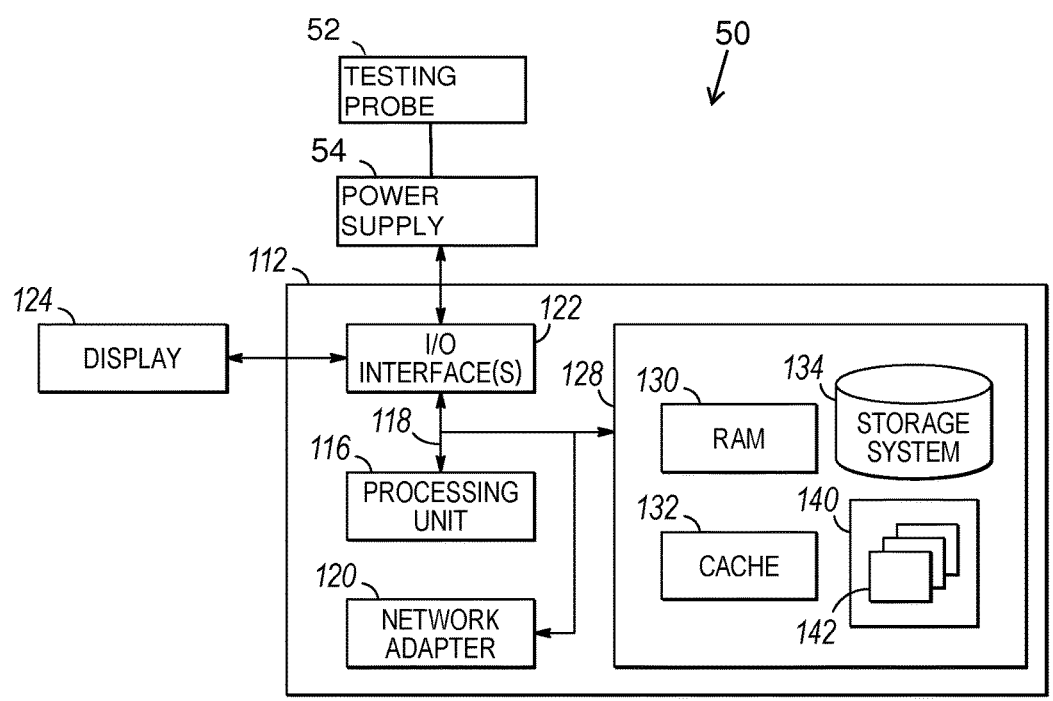
FIG. 2 is a diagrammatic view of a testing system that may be used to determine dielectric reliability using the test structure.

With reference to FIG. 2, a testing system 50 may be used to perform dielectric reliability tests of one or more of the correlated pairs of lines 12 and rows 16 of contacts and/or the correlated pairs of lines 14 and rows 18 of contacts of the test structure 10. The testing system 50 may comprise a semiconductor parameter analyzer that is coupled with a testing probe 52. The testing probe 52 can provide a voltage from a power supply 54 in parallel to different sets of pads 30, 34 and/or to different sets of pads 32, 36.

The testing system 50 may also be configured to measure a stress current passing through the testing probe 52 under the application of the voltage. The type of electrical stress test may comprise a constant voltage test, a constant current test, a ramp voltage test, a ramp current test, etc. The electrical stress is applied as an electric field across the dielectric layer 40 in the gap $g_1$. For example, the testing system 50 may cause a constant stress voltage to be provided to the testing probe 52 over a time period in which the test probe is brought into contact different sets of pads 30, 34 and/or to different sets of pads 32, 34. The stress currents are monitored and sampled by the testing system 50. In order to reduce the measurement time, the test structure 10 may be held at an elevated temperature (e.g., 125° C.) during the current measurements by the testing system 50. The stress currents may be evaluated as a function of measurement time because the stress currents tend to vary in magnitude with time in response to the electrical stress applied by the testing system 50 to the test structure 10. Sharp current spikes may be observed when one of the correlated pairs of lines 12 and rows 16 of contacts or lines 14 and rows 18 of contacts in the test structure 10 exhibits hard breakdown of the dielectric layer.

Reliability testing of the dielectric layer 40 using test structure 10 may be accelerated by applying excess stress (voltage and/or current) far beyond operating conditions to the dielectric layer 40 to accelerate the breakdown process because reliability testing under operating conditions will take an impractically long period of time. The stress currents may be analyzed by the testing system 50 to determine a failure distribution, estimated lifetime value, and/or an acceleration factor of the stress can be obtained from a burn-in condition. The lifetime of a dielectric layer under operating conditions can then be obtained by extrapolating the distribution under reliability testing conditions to the operating conditions.

The testing system 50 may include a computer system 112 having one or more processors or processing units 116, a system memory 128, and a bus 118 that couples various system components including system memory 128 to each processing unit 116. Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system 112 typically includes a variety of computer system readable media. Such media may be any available media that is accessible by computer system 112, and it includes both volatile and non-volatile media, removable and non-removable media.

System memory 128 can include computer system readable media in the form of volatile memory, such as random access memory (RAM) 130 and/or cache memory 132. Computer system 112 may further include other removable/non-removable, volatile/non-volatile computer system storage media. By way of example only, storage system 134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, or other optical media can be provided. In such instances, each can be connected to bus 118 by one or more data media interfaces. As will be further depicted and described below, system memory 128 may include at least one program product having a set (e.g., at least one) of program modules that are configured to carry out the functions of embodiments of the invention.

Program/utility 140, having a set (at least one) of program modules 142, may be stored in system memory 128 by way of example, and not limitation, as well as an operating system, one or more application programs, other program modules, and program data. Each of the operating system, one or more application programs, other program modules, and program data or some combination thereof, may include an implementation of a networking environment. Program modules 142 generally carry out the functions and/or methodologies of embodiments of the invention as described herein. For example, the program modules 142 may control the operation of the testing system 50.

Computer system 112 may also communicate with one or more external devices such as a keyboard, a pointing device, a display 124, etc.; one or more devices that enable a user to interact with computer system 112; and/or any devices (e.g., network card, modem, etc.) that enable computer system 112 to communicate with one or more other computing devices. Such communication can occur via Input/Output (I/O) interfaces 122. Still yet, computer system 112 can communicate with one or more networks such as a local area network (LAN), a general wide area network (WAN), and/or a public network (e.g., the Internet) via network adapter 120. As depicted, network adapter 120 communicates with the other components of computer system 112 via bus 118. It should be understood that although not shown, other hardware and/or software components could be used in conjunction with computer system 112. Examples, include, but are not limited to: microcode, device drivers, redundant processing units, external disk drive arrays, RAID systems, tape drives, and data archival storage systems, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for testing reliability of a dielectric material, the structure comprising:
   a first row of contacts;
   a first linear feature comprised of a conductor, the first linear feature laterally spaced in a first direction at a minimum distance from the first row of contacts; and
   a second row of contacts laterally spaced in the first direction from the first row of contacts by a distance equal to two times a minimum pitch,
   wherein the first row of contacts includes a first plurality of contacts, the second row of contacts includes a second plurality of contacts, the first plurality of contacts and the second plurality of contacts are comprised of a conductive material, and the first linear feature is laterally positioned between the first row of contacts and the second row of contacts.

2. The structure of claim 1 further comprising:
   a dielectric layer comprised of the dielectric material,
   wherein a portion of the dielectric material of the dielectric layer is located between the first linear feature and the first row of contacts.

3. The structure of claim 1 further comprising:
   a dielectric layer comprised of the dielectric material,
   wherein a portion of the dielectric material of the dielectric layer is located between the first linear feature and the second row of contacts.

4. The structure of claim 1 wherein a first space between the first linear feature and the second row of contacts is free of additional linear features of the conductor and additional rows of contacts.

5. The structure of claim 4 wherein the first space comprises a first area, and the first linear feature and the first row of contacts occupy a second space having a second area equal to the first area.

6. The structure of claim 5 further comprising:
   a dielectric layer comprised of the dielectric material,
   wherein a portion of the dielectric material of the dielectric layer is located between the first linear feature and the first row of contacts.

7. The structure of claim 5 further comprising:
   a third row of contacts; and
   a third linear feature comprised of the conductor, the third linear feature laterally spaced in the first direction at the minimum distance from the third row of contacts,
   wherein the third row of contacts and the third linear feature occupy a third space that is equal in size to the second space and that is laterally spaced in a second direction perpendicular to the second space.

8. The structure of claim 7 further comprising:
   a dielectric layer comprised of the dielectric material,
   wherein a first portion of the dielectric material of the dielectric layer is located between the first linear feature and the first row of contacts, and a second portion of the dielectric material of the dielectric layer is located between the third linear feature and the third row of contacts.

9. The structure of claim 5 further comprising:
   a second linear feature comprised of the conductor, the second linear feature laterally spaced at the minimum distance from the second row of contacts,
   wherein the second linear feature and the second row of contacts occupy a third space having a third area equal to the second area.

10. The structure of claim 9 further comprising:
    a dielectric layer comprised of the dielectric material,
    wherein a first portion of the dielectric material of the dielectric layer is located between the first linear feature and the first row of contacts, and a second portion of the dielectric material of the dielectric layer is located between the second linear feature and the second row of contacts.

11. The structure of claim 1 further comprising:
    a second linear feature comprised of the conductor, the second linear feature laterally spaced at the minimum distance from the second row of contacts.

12. The structure of claim 1 further comprising:
    a first pad coupled with the first linear feature;
    a second pad coupled with the first row of contacts; and
    a third pad coupled with the second row of contacts,
    wherein the second pad and the third pad are coupled in parallel.

13. The structure of claim 12 further comprising:
    a second linear feature comprised of the conductor, the second linear feature laterally spaced at the minimum distance from the second row of contacts; and
    a fourth pad coupled with the second linear feature,
    wherein the first pad and the fourth pad are coupled in parallel.

14. The structure of claim 1 wherein the first linear feature comprises polysilicon for a gate of a field-effect transistor, and further comprising:
    a dielectric layer comprised of the dielectric material,
    wherein a first portion of the dielectric material of the dielectric layer is located between the first linear feature and the first row of contacts, and the first plurality of contacts in the first row of contacts comprise the conductive material deposited in a plurality of vias defined in the dielectric layer.

15. A method for forming a structure used to test reliability of a dielectric material, the method comprising:
    forming a first row of contacts;
    forming a first linear feature comprised of a conductor, the first linear feature laterally spaced in a first direction at a minimum distance from the first row of contacts; and
    forming a second row of contacts laterally spaced in the first direction from the first row of contacts by a distance equal to two times a minimum pitch,
    wherein the first row of contacts includes a first plurality of contacts and the second row of contacts includes a second plurality of contacts, the first plurality of contacts and the second plurality of contacts are comprised of a conductive material, and the first linear feature is laterally positioned between the first row of contacts and the second row of contacts.

16. The method of claim 15 further comprising:
    forming a dielectric layer comprised of the dielectric material,
    wherein a portion of the dielectric material of the dielectric layer is located between the first linear feature and the first row of contacts.

17. The method of claim 15 wherein a first space between the first linear feature and the second row of contacts is free of additional linear features of the conductor and additional rows of contacts.

18. The method of claim 17 wherein the first space comprises a first area, and the first linear feature and the first row of contacts occupy a second space having a second area equal to the first area.

19. The method of claim 15 further comprising:
forming a first pad coupled with the first linear feature;
forming a second pad coupled with the first row of contacts; and
forming a third pad coupled with the second row of contacts,
wherein the second pad and the third pad are coupled in parallel.

20. The method of claim 15 wherein the first linear feature comprises polysilicon for a gate of a field-effect transistor, and further comprising:
forming a dielectric layer comprised of the dielectric material; and
forming a plurality of vias in the dielectric material,
wherein a first portion of the dielectric material of the dielectric layer is located between the first linear feature and the first row of contacts, and the first plurality of contacts in the first row of contacts comprise the conductive material deposited in the vias.

* * * * *